United States Patent [19]

Casati et al.

[11] Patent Number: 5,244,838

[45] Date of Patent: Sep. 14, 1993

[54] PROCESS AND APPARATUS FOR ASSEMBLING AND RESIN-ENCAPSULATING A HEAT SINK-MOUNTED SEMICONDUCTOR POWER DEVICE

[75] Inventors: Paolo Casati, Giovanni; Carlo C. De Martiis; Giuseppe Marchisi, both of Milan, Italy

[73] Assignee: SGS-Thomson Microelectronics S.r.l., Milan, Italy

[21] Appl. No.: 784,303

[22] Filed: Oct. 31, 1991

[30] Foreign Application Priority Data

Oct. 31, 1990 [IT] Italy ................ 83643 A/90

[51] Int. Cl.5 ................ H01L 21/56; H01L 21/58; H01L 21/60; H01L 21/603
[52] U.S. Cl. ................ 437/212; 437/214; 437/902; 264/272.17
[58] Field of Search ................ 264/272.14, 272.17; 437/212, 214, 220, 222, 902

[56] References Cited

U.S. PATENT DOCUMENTS

| 4,377,548 | 3/1983 | Pierpoint | 264/278 |
| 4,470,786 | 9/1984 | Sand et al. | 264/272.14 |
| 4,954,307 | 9/1990 | Yokoyama | 264/272.14 |
| 5,091,341 | 2/1992 | Asada et al. | 437/902 |

Primary Examiner—Olik Chaudhuri
Assistant Examiner—David E. Graybill
Attorney, Agent, or Firm—Seed and Berry

[57] ABSTRACT

A die-stamped frame is fastened to a heat sink metal baseplate by wedging flexible tabs into receiving indentations of the baseplate while keeping the frame substantially in contact with the surface of the baseplate. The wire welding operations may then take place on the end of the fingers of the patterned metal frame while the same are solidly resting on the surface of the baseplate thus facilitating the welding. The backing-off of the metal frame from the surface of the heat sink baseplate takes place upon the closing of the mold used for encapsulating in resin the device. The injection of the resin and its solidification "freezes" the pins in the backed-off position imposed by the mold upon closing, thus ensuring the electrical isolation between the pins and the integral heat sink baseplate.

4 Claims, 2 Drawing Sheets

PROCESS AND APPARATUS FOR ASSEMBLING AND RESIN-ENCAPSULATING A HEAT SINK-MOUNTED SEMICONDUCTOR POWER DEVICE

DESCRIPTION

1. Field of the Invention

The present invention relates to an assembly and resin encapsulation process for a semiconductor power device comprising an integral metal heat sink baseplate on a face of which the encapsulating resin body is formed.

2. Background of the Invention

The assembly and resin-encapsulation of a semiconductor power device commonly comprises the following steps:

fastening a die-stamped metal frame or strip of frames to a flat metal heat sink baseplate by wedging at least two tabs formed in two opposite sides of each die-stamped frame into indentations purposely formed in opposite sides of the baseplate so that once the wedging has been made, the metal frame or the strip of metal frames is supported by said wedged tabs parallel above the face of the baseplate and at a separation distance therefrom of some tenth of a millimeter;

bonding the semiconductor die or dies onto the face of the heat sink baseplate in a central area in respect to the relative die-stamped metal frame so as to be surround by the inner ends of a plurality of coplanar fingers patterned in the die-stamped metal frame, which will constitute external connection pins, functionally isolated among each other and from the metal heat sink in the finished device;

electrically connecting the metal pads of the front of the semiconductor die to the fingers of the metal frame, respectively, by means of a metal wire welded to a pad and to the inner end of a finger of the metal frame;

transferring the assembly inside a mold and injecting an encapsulating resin which, upon solidification, "freezes" the various parts of the assembly in their respective spatial positions, thus isolating the fingers and the relative wire connections among each other as well as from the heat sink baseplate on which the encapsulating resin body is molded;

separating the various devices, which may have been simultaneously encapsulated in a single mold, from the outer perimetral band of the die-stamped metal frame or frames, and separating the various external pins (i.e., the outer portions of the fingers of the die-stamped metal frame extending out of the cavity of the encapsulation mold, passing between the opposed mating surfaces of the mold and of the counter-mold).

Customarily, in accordance with modern fabrication techniques, the welding of the connecting wires to the metallized pads on the front of the semiconductor dies and to the respective finger or pin of the metal frame is performed by a thermo-sonic mechanism. Practically, the wire is pinned by means of a heated metal electrode against the metallic surface of the pad and of the finger's end. Mechanical vibrations of sonic and ultrasonic frequency are transmitted to the pinned wire through the heated metal electrode, causing a frictional, localized overheating which is sufficient to momentarily melt the metal so that, upon re-solidification, a permanent welding between the wire and the metallized surface of the pad and the surface of the metal finger, respectively, is established.

The flexibility of the fingers' inner end portion, which extends in a cantilever manner from an outer perimetral band of the die-stamped frame, under the force, though relatively small, which is exerted by the welding electrode, often represents a problem for reliably welding the wires. In some cases, this problem is overcome by inserting spacing laminae of a dielectric material in the gap between the surface of the flat heat sink baseplate and the fingers of the die-stamped metal frame, in order to support the cantilever ends of the frame fingers during the welding of the wires. These dielectric supports may also be left in place and be encapsulated in resin body. The insertion of these dielectric spacers or supports remains a time-consuming and expensive practice in terms of production costs and is impractical altogether.

SUMMARY OF THE INVENTION

The present invention effectively overcomes this problem by permitting on one hand to carry out the welding of the wires on the finger ends while the latter are firmly supported by directly resting on the surface of the flat metal heat sink baseplate and on the other hand to positively ensure the separation and the permanency of the separation of the metal fingers of the frame from the metal heat sink baseplate after having completed the welding operations during the encapsulation in resin of the mounted assembly. This is accomplished by means of a mechanical positioning action which is exerted by a counter-mold upon closing over the metal fingers and the wedged protrusions or tabs of the die-stamped metal frame. The permanent separation of the encapsulated metal parts is accomplished by retaining the fingers away from the heat sink while injecting the encapsulating resin into the mold and solidifying it before opening the mold, thus eliminating the possibility of accidental intervening deformations of preassembled parts which, if they occur, could cause intolerable electrical shorts in the finished product. The different aspects and advantages of the invention will become more evident through the following detailed description of an embodiment thereof and by reference to the attached drawings.

DETAILED DESCRIPTION OF THE INVENTION

In accordance with the process of the invention, to a die-stamped strip of patterned frames, commonly of copper or of nickel coated copper, heat sink metal baseplates for every patterned frame of the strip are fastened. These heat sinks may be flat metal plates of copper, nickel-coated copper, silver-coated copper or other suitable material, made in a definite form by die-stamping. The common practice of attaching a single metal strip to a strip of die-stamped frames and to separate the distinct encapsulated devices after the resin encapsulation by cutting the composite piece along border lines between adjacent devices of the composite strip assembly normally would be compatible with the process of the present invention.

Figure 1:
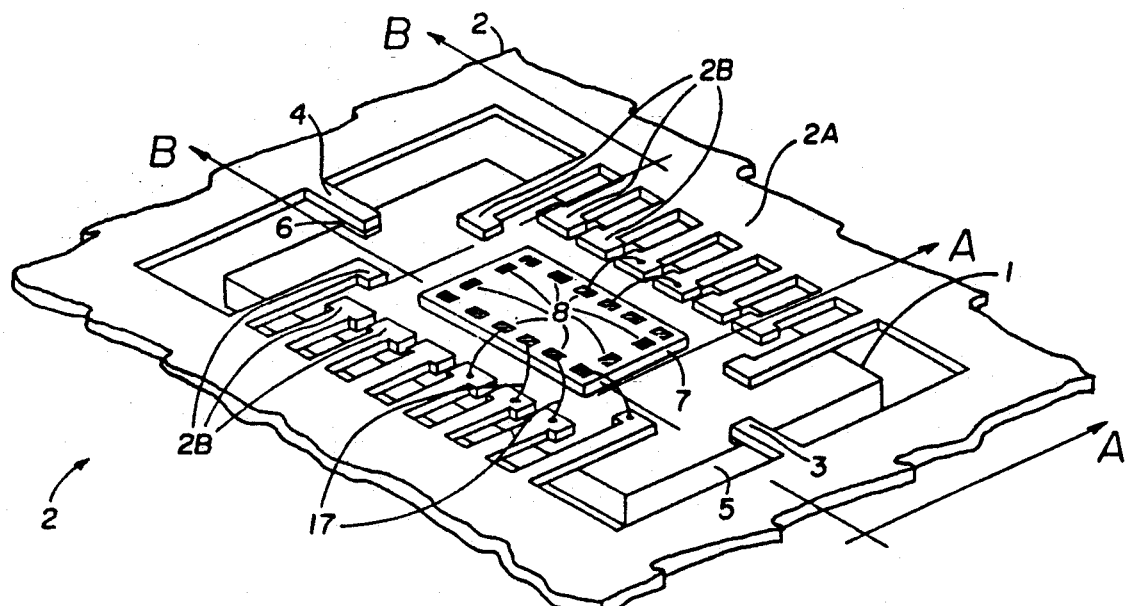
FIG. 1 is a partial schematic view of a pre-mounted frame and heat sink assembly, according to the process of the invention.
Figure 2:
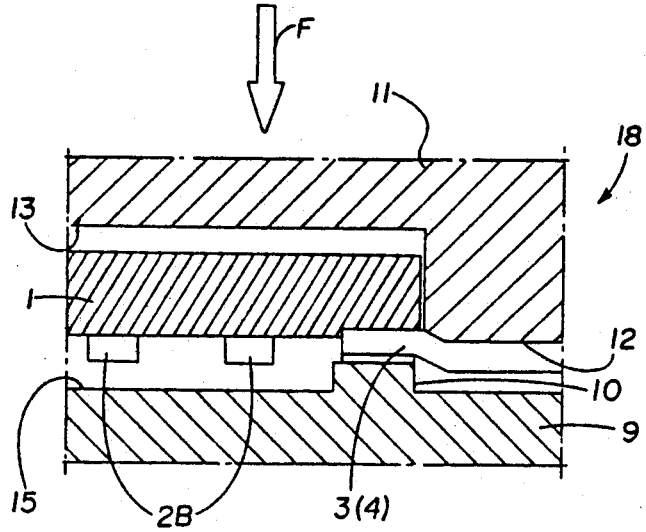
FIG. 2 is a partial cross-sectional view taken along lines A—A of FIG. 1, with the mold in place and open, prior to closing the mold completely.
Figure 3:
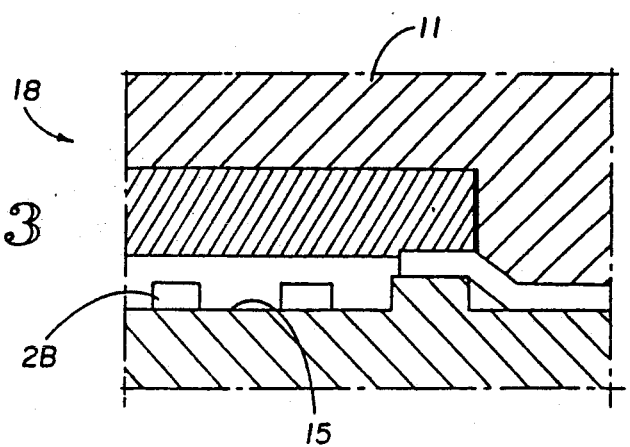
FIG. 3 is a partial cross-sectional view taken along lines A—A of FIG. 1, with the mold in place, fully closed.
Figure 4:
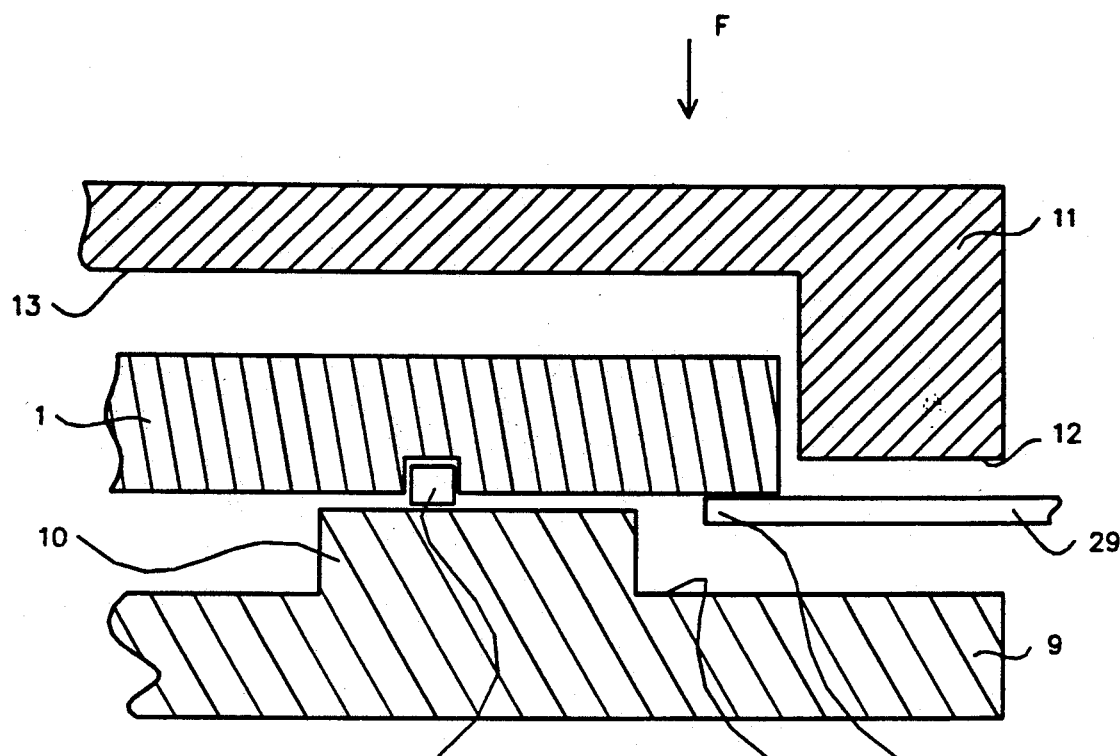
FIG. 4 is a partial cross-sectional view taken along lines B—B of FIG. 1, with the mold in place and open, prior to closing the mold completely.
Figure 5:
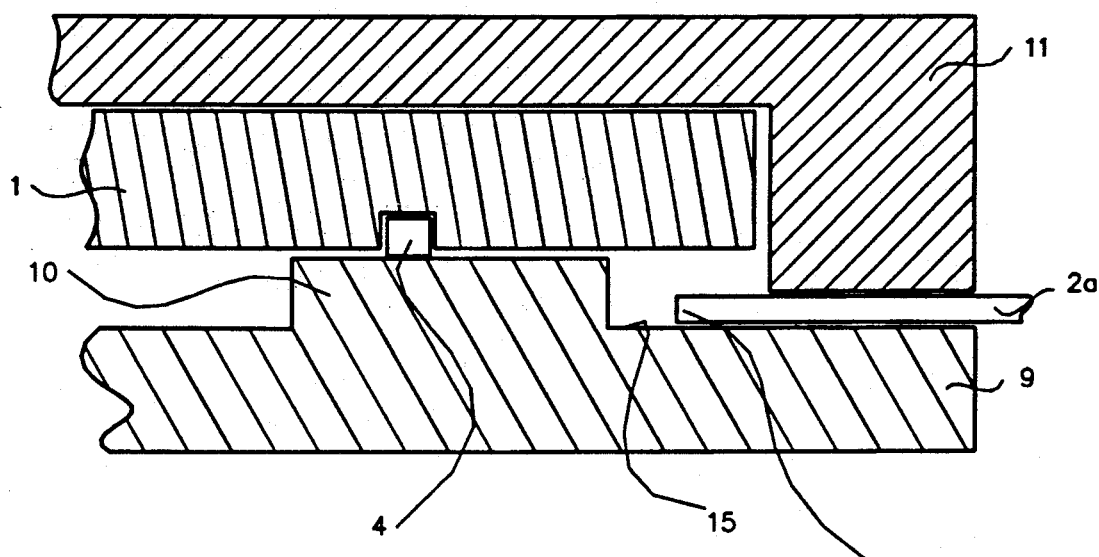
FIG. 5 is a partial cross-sectional view taken along lines B—B of FIG. 1, with the mold in place, fully closed.

With reference to the partial schematic view of FIG. 1, a flat metal heat sink base 1 is fastened to a strip of die-stamped metal frames 2, facing a respective frame 2a of the strip of frames. In one embodiment, the fastening of the heat sink 1 to the strip of frames 2 is effected by utilizing two purposely patterned tabs 3 and 4 of the die-stamped unit frame 2a. These tabs 3 and 4 are commonly formed by die-stamping on opposite sides of each unit frame 2a of a die-stamped strip. The wedging is effected by forcing the tabs 3 and 4 inside two indentations or slots 5 and 6, respectively, which are purposely formed in the opposite sides of the heat sink 1. The tabs 3 and 4 are press-fit into the indentations 5 and 6, and the indentations are smaller than the tabs, so that, upon forcibly inserting the metal tabs 3 and 4 into the respective indentations, the metal tabs 3 and 4 and/or the heat sink 1 undergoes a plastic deformation which establishes a stable mechanical anchoring of the heat sink 1 to the unit frame 2a of the strip 2. Alternatively, the heat sink 1 may, of course, be attached to the frame 2 by other techniques, such as welding, bonding, adhesion, or the like.

According to the process of the invention, in the wedging embodiment, the wedging is carried out without substantially bending the tabs 3 and 4, that is, by leaving the major portion of the tabs 3 and 4 substantially coplanar to the other patterned portions of the die-stamped frame so that the fingers 2b of the frame remain abutting against the surface of the heat sink 1.

In the embodiment shown in FIG. 1, a typical metal frame configuration for a so-called Dual-In-Line, 16-pin package (16-pin DIP package), is depicted, wherein, after having completed the semiconductor die assembly, resin encapsulation and cutting of the external pins for separating and discarding the outer perimeter portion of the die-stamped frame (depicted in FIG. 1 only partially) are completed. In this type of package, the pins of the device are disposed along two opposite, parallel sides of the encapsulation resin body, which generally has a parallelepiped shape. Of course, the process of the invention may similarly be utilized also in case of different types of metal frames relative to other standardized plastic packages for power devices.

Returning to FIG. 1, after having fastened the heat sink 1 to the unit frame 2a, the semiconductor wafer chip 7 is bonded, usually by means of a conductive cement that typically may be constituted by an epoxy adhesive loaded with conducting metal powders (such as silver powder) capable of ensuring good thermal coupling between the rear of the semiconductor chip 7 and the heat sink 1 within a central area of the face of the heat sink 1.

Subsequently, the welding of connecting wires 17 to the metallized pads 8 of the front of the semiconductor chip 7 and to the inner ends of the respective patterned fingers 2b of the die-stamped frame is performed. The welding is commonly carried out by means of automatic machines through a thermo-sonic welding process whereby a thin metal wire 17 of aluminum, gold, copper, or the like is pressed by a heated electrode of the welding machine on the metallized surface of the pad 8 (and also on the surface of the end portion of a finger 2b of the metal frame 2) and heat and mechanical energy in the form of sonic and/or ultrasonic frequency vibrations are transmitted through the thickness of the wire to the contact area between the wire 17 and the metal surface 8 in order to cause a localized melting of the metal for a very short time, sufficient to establish a permanent welding between the wire 17 and the metal surface 8. The welding process is highly automated and is usually performed in a very short time by utilizing highly sophisticated welding machines. The welding of the wires on the end portions of the fingers 2b of the frames 2 takes place with the ends of the fingers 2b of the metal frame solidly resting on the face of the heat sink 1. With the fingers 2b on the base 1, they are not subject to flections induced by the load that may be exerted by the welding electrode. This highly improves the reliability of the welds produced.

On the other hand, it is desirable that, upon completion of welding wires 17 to the fingers 2b, the fingers 2b be electrically isolated from each other as well as from the metal heat sink 1. Such a condition is ensured, according to the process of the present invention, by positively separating the coplanar metal fingers 2b from the face of the metal heat sink 1 on which they were abutting during the welding step and maintaining the metal frame in this raised-off position in respect to the heat sink baseplate 1 during the injection of the encapsulating resin in the mold and until the resin has fully solidified, in order to "freeze" the metal frame fingers in their forcibly placed spatial position in relation to the heat sink baseplate 1. The release of the actuating means which had forcibly determined the separation and spacing-off of the fingers 2b from the heat sink may then take place without the fingers 2b being able to elastically return in contact with the metallic heat sink.

In one embodiment, the actuating means for raising and keeping the metal fingers 2b of the frame 2 separate from the heat sink 1 are constituted by the cooperating halves of the mold 18 used for encapsulating the assembly. The resin injection mold 18 may be composed of a first part 9 which is substantially flat and which may be provided with ridges or post supports 10 onto which the assembly face of the heat sink 1 rests. These supports 10 may be disposed along the sides of the perimeter of the face of the heat sink wherein the fastening tabs 3 and 4 of the metal frame 2 are fastened and through which there are not fingers 2b of the die-stamped metal frame extending. A counter-mold 11, having a substantially flat mating face 12, may be provided with a cavity 13 of dimensions sufficient to completely contain within said cavity 13 the heat sink 1. By closing on the assembly rested on said first part of the mold 9, the counter-mold 11 causes the flection of the fingers 2b of the die-stamped metal frame which extend beyond the perimeter of the heat sink 1. These outer portions of the metal frame 2a are pinned against the flat surface of the first part 9 of the mold, thus positively separating the coplanar fingers 2b of the metal frame from the face of the heat sink 1. At this point, a fluid-encapsulating resin may be injected into the space defined between the surface of the first part of the mold and the opposing surface of the heat sink baseplate and laterally by the counter-mold and partially by the inner surface of said support ridges of the first part of the mold.

Schematically, the action of separation of the fingers of the metal frame from the heat sink exerted upon closing the resin injection mold is depicted in the partial, sectional views of FIGS. 2-5.

The first part of the mold 9 is provided with ridges 10 which may extend a selected height above a bottom portion 15, essentially along at least two opposite sides of the perimeter of the face of the heat sink 1 wherein the wedged fastening tabs 3 and 4 of the frame are located. Preferably, the ridges 10 do not extend for the entire length of the relative side of the perimeter of the heat sink 1 but have a length sufficient to provide at least two rest surfaces for the assembly and their position coincides with the tab wedging points. The sectional profile of the fingers 2b of the metal frame, arranged along sides of the heat sink 1 orthogonal to the sides in which the tabs 3 and 4 are wedged in their respective seats, is shown in the partial elevation views of FIGS. 2-5. The counter-mold 11 has a substantially flat surface 12 and a cavity 13 which has dimensions suitable to completely contain the heat sink 1 inside the cavity upon the closing of the mold.

Upon closing of the mold (schematically shown in FIGS. 2 and 4 by the arrow F), the flat surface 12 of the counter-mold 11 acts on the parts of the metal frame which extend beyond the perimeter of the cavity, i.e., beyond the perimeter of the heat sink 1, and lowers the coplanar fingers 2b of the metal frame 2a until they abut against the surface of the first part 9 of the mold 8, thus positively separating and spacing them by an exactly pre-established distance from the face of the heat sink 1. Of course, the displacement of the coplanar fingers of the metal frame is allowed by a sufficient length and flexibility of the connecting wires 17, which have already been welded, as well as by the forced bending of the tabs 3 and 4.

In an alternative embodiment, the support 10 is positioned on the mold member 9, where it does not contact tab 3 or 4. The support 10 would thus be slightly higher to provide the same spacing of the fingers 2b from the base 1 when the mold is closed. In this embodiment, the support 10 is in the form of support posts that directly abut against and contact the heat sink base 1 when the mold is fully closed. Support posts 10 may be provided at one or more corner regions or side regions of the heat sink base 1 in place of or in addition to being along the perimeter at a side region, as shown in FIGS. 2-5. Having the support 10 directly contact the base 1 itself at one or more locations provides a stable support for the base 1 when the mold is fully closed and ensures that the base 1 is held in place, with the fingers 2b spaced therefrom when resin is injected into the mold. In an alternative embodiment, the support 10 has a recess to receive the tabs 3 and 4 so that the base 1 is in contact with and flush with the entire top of ridge 10 and the tabs 3 and 4 are in the recess.

As will be evident to the skilled technician, the process of the invention may be carried out also in the case wherein a mold or counter-mold having cooperating, comb-like, ridged mating surfaces for accommodating the figures and sealing the spaces between adjacent fingers, along the respective sides, as well as in the case wherein the metal frames are patterned by die-stamping with an uninterrupted transversal band, temporarily bridging the fingers and which may conveniently act as a gasketing portion for sealing the perimeter of the cavity of the mold and preventing the exit of the resin between adjacent fingers. This transversal band may then be cut between adjacent pins by a special tool after molding and separating the outer perimetral band of the assembly frame in order to electrically separate the pins from each other.

We claim:

1. A process for assembling and encapsulating in resin a die of semiconductor wafer having metallized pads for wiring connections, which comprises fastening together a patterned metal frame and a flat metallic heat sink baseplate, disposed in respectively parallel planes, by wedging fastening tabs of said metal frame into indentations formed on opposite sides of said heat sink, and successively cementing said die on said heat sink, connecting said pads to the ends of coplanar fingers of said patterned frame by means of metal wires welded thereto, placing the mounted assembly in a mold capable of defining a cavity for containing said metal heat sink, said die, said connecting wires and an inner portion of said coplanar fingers, which extend beyond the perimeter of said cavity by passing between perimetral mating surfaces of said mold and of a counter-mold, and injecting resin into said cavity for encapsulating the assembly while leaving exposed a surface of said heat sink baseplate and ensuring the electric isolation of each of said coplanar fingers from said metallic heat sink, characterized by comprising the following steps:

fastening said metal frame to said heat sink and maintaining said coplanar fingers of the metal frame adjacent the surface of the heat sink;

welding said metal wires on the ends of said coplanar fingers contacting the surface of the heat sink;

placing the mounted assembly on a substantially flat mold provided with raised portions for supporting the heat sink by said surface thereof, the supports being arranged along the sides of the perimeter of the heat sink on which said tabs of the metal frame are anchored thereto;

closing the mold by means of a counter-mold having a substantially flat mating surface provided with a cavity capable of completely containing said heat sink, said counter-mold pushing said fingers while bending said fastening tabs against the surface of said flat mold thus spacing said coplanar fingers from the surface of the heat sink;

injecting an encapsulation resin in the cavity defined between the surface of said mold and the opposed surface of the heat sink and laterally by said counter-mold and, partially, by the inner face of said raised supports of the mold; and solidifying the injected resin within the space comprised between said surface of the heat sink and said fingers of the metal frame before opening the mold and recovering the encapsulated device.

2. A process for assembling and encapsulating in resin a semiconductor power device incorporating a metallic heat sink baseplate, which comprises:

fastening a patterned metal frame to a heat sink baseplate while maintaining the metal frame substantially in abutment with the surface of the baseplate;

completing wire welding operations on the frame resting on the baseplate;

placing the completed assembly into a mold and causing, upon closing the mold, the separation of the metal frame from said heat sink baseplate while yielding bending said fastening tabs; and injecting and solidifying an encapsulation resin inside the mold before opening the mold and recovering the encapsulated device.

3. A method of encapsulating a semiconductor die inside a plastic package comprising:
   attaching said die to a base member;
   attaching said base member to a conductive lead frame, said conductive frame including a plurality of conductive fingers extending adjacent said die and in contact with said base member;
   attaching electrically conductive metal wires to said fingers, said fingers being in contact with said base member during said attaching step;
   attaching said conductive metal wires to said die to provide an electrically conductive path from said die to said lead frame;
   placing said base having said die attached thereto adjunct a first mold member, said first mold member having supports in contact with said base;
   forming a mold around said base and said conductive fingers, said mold including a cavity for receiving said base member having said die attached;
   moving said conductive fingers out of contact with said base;
   injecting a plastic molding material into said mold, said conductive fingers being spaced from said base while said molding material is being injected into said mold;
   solidifying said molding material within said mold, said fingers being retained spaced from said base by said solidified molding material; and
   removing said encapsulated die from said mold.

4. The method according to claim 3 wherein said step of moving said conductive fingers out of contact with said base is automatically accomplished simultaneously with forming said mold, said mold including a flat surface that contacts said conductive fingers and forces them away from said mold is closed.

* * * * *

UNITED STATES PATENT AND TRADEMARK OFFICE
CERTIFICATE OF CORRECTION

PATENT NO. : 5,244,838

DATED : September 14, 1993

INVENTOR(S) : Paolo Casati et al.

It is certified that error appears in the above-identified patent and that said Letters Patent is hereby corrected as shown below:

In claim 4, column 8, line 19, after "from said" and before "mold", please insert --base as said--.

Signed and Sealed this

Twenty-fourth Day of May, 1994

Attest:

BRUCE LEHMAN

Attesting Officer

Commissioner of Patents and Trademarks